United States Patent [19]
Chang et al.

[11] Patent Number: 6,030,863
[45] Date of Patent: Feb. 29, 2000

[54] GERMANIUM AND ARSENIC DOUBLE IMPLANTED PRE-AMORPHIZATION PROCESS FOR SALICIDE TECHNOLOGY

[75] Inventors: Shou-Zen Chang, Hsin-Chu; Chaochieh Tsai, Taichung; Cheng Kun Lin, Taipei; Chi Ming Yang, Hsin-Chu, all of Taiwan

[73] Assignee: Taiwan Semiconductor Manufacturing Company, Hsin-Chu, Taiwan

[21] Appl. No.: 09/151,952

[22] Filed: Sep. 11, 1998

[51] Int. Cl.⁷ .................................................. H01L 21/8238
[52] U.S. Cl. ........................... 438/229; 438/232; 438/306; 438/515
[58] Field of Search ..................................... 438/199, 228, 438/229, 231, 291, 232, 297, 301, 305, 515, 306, 585, 528

[56] References Cited

U.S. PATENT DOCUMENTS

| | | | |
|---|---|---|---|
| 4,111,719 | 9/1978 | Mader et al. | 148/1.5 |
| 4,683,645 | 8/1987 | Naguib et al. | 437/41 |
| 4,835,112 | 5/1989 | Pfiester et al. | 437/24 |
| 5,134,447 | 7/1992 | Ng et al. | 257/607 |
| 5,145,794 | 9/1992 | Kase et al. | 437/24 |
| 5,254,484 | 10/1993 | Hefner et al. | 437/24 |
| 5,312,766 | 5/1994 | Aronowitz et al. | 437/24 |
| 5,393,676 | 2/1995 | Anjum et al. | 438/301 |
| 5,561,072 | 10/1996 | Saito | 437/24 |
| 5,571,735 | 11/1996 | Mogami et al. | 437/41 |
| 5,602,045 | 2/1997 | Kimura | 438/305 |
| 5,633,177 | 5/1997 | Anjum | 438/301 |
| 5,795,808 | 8/1998 | Park | 438/301 |

OTHER PUBLICATIONS

C.Y. Chang et al, "VLSI Technology", The McGraw–Hill Companies, Inc, 1990, p397–402.
S.Wolf et al, "Silicon Processing for the VLSI Era" vol. 1, Lattice Press, Sunset Beach, CA. 1986, p293–294.

*Primary Examiner*—John F. Niebling
*Assistant Examiner*—Christopher Lattin
*Attorney, Agent, or Firm*—George O. Saile; Stephen B. Ackerman

[57] ABSTRACT

A method for forming salicide contacts and polycide conductive lines in integrated circuits is described which employs the ion implantation of both germanium and arsenic into polysilicon structures and into source/drain MOSFET elements is described. The method is particularly beneficial in the manufacture of sub-micron CMOS integrated circuits. Germanium is implanted into the polysilicon and into the source/drain surfaces forming a amorphized surface layer. Next a low dose, low energy arsenic implant is administered into the amorphized layer. The low dose shallow arsenic implant in concert with the amorphized layer initiates a balanced formation of titanium suicide over both NMOS and PMOS devices in CMOS integrated circuits without degradation of the PMOS devices with an accompanying reduction of gate-to-source/drain shorts. Amorphization by the electrically neutral germanium ions permits the use of a lower dose of arsenic than would be required if arsenic alone were implanted. The combined amorphization effect of the germanium and arsenic implants also facilitates a suicide phase transition on sub-micron wide polycide lines thereby improving their conductivity.

24 Claims, 5 Drawing Sheets

GERMANIUM AND ARSENIC DOUBLE IMPLANTED PRE-AMORPHIZATION PROCESS FOR SALICIDE TECHNOLOGY

RELATED PATENT APPLICATION

TSMC-97-457, U.S. application Ser. No. 09/131,321, filed Aug. 7, 1998, "SILICON AND ARSENIC DOUBLE IMPLANTED PRE-AMORPHIZATION PROCESS FOR SALICIDE TECHNOLOGY", S. Z. Chang, C. C. Tsai, C. H. Ho and C. K. Lin, assigned to a common assignee.

BACKGROUND OF THE INVENTION

1. Field of the Invention

The invention relates to processes for the manufacture of semiconductor devices and more particularly to processes for forming self-aligned silicide contacts on polysilicon gate field effect transistors.

2. Description of Prior Art

Complimentary metal oxide semiconductor(CMOS) field effect transistor(FET) technology involves the formation and utilization of n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

Figure 1:
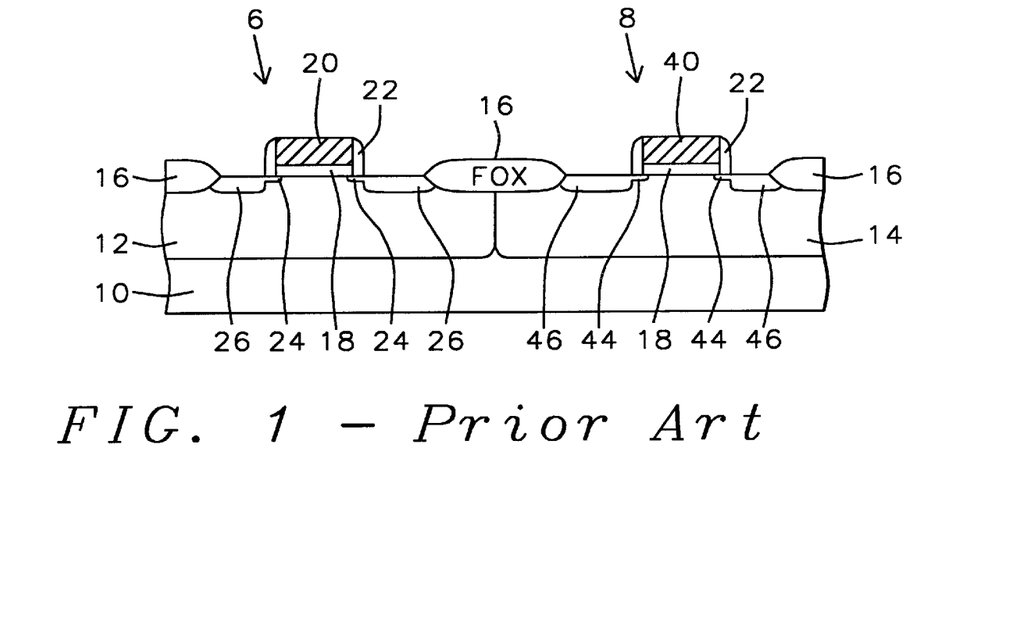
FIG. 1 is a cross section of a CMOS structure having self-aligned polysilicon gate MOSFETs formed by a prior art process at the stage of manufacture after source and drain implantation is completed.

One well known form of the CMOS configuration is the twin-well structure is shown in cross section by FIG. 1. By processes of photolithography and ion implantation, adjacent islands of p-type silicon 12 and n-type silicon 14 are formed in the surface of silicon wafer 10. Field oxide isolation(FOX) regions 16 are formed and gate oxide 18 is grown in the exposed silicon regions. A conductive layer of polysilicon is deposited and patterned to form the gate electrodes of the PMOS device 6 and the NMOS device 8. Using the gate electrodes 20 and 40 as a mask, the LDD (lightly doped drain) regions 24 and 44 are formed. The sidewalls 22 are next formed by anisotropically etching a blanket, conformally deposited mask material, for example silicon oxide. The sidewalls 22 protect the LDD regions 24,44 from a subsequent heavier dose source/drain ion implant which forms the source/drain regions 26 and 46. The formation of the PMOS device 6 and the NMOS device 8 is now complete. It is now necessary to form reliable ohmic contacts to the elements of the two MOSFETs as well as enhance the conductivity of the polysilicon gates.

Figure 2:
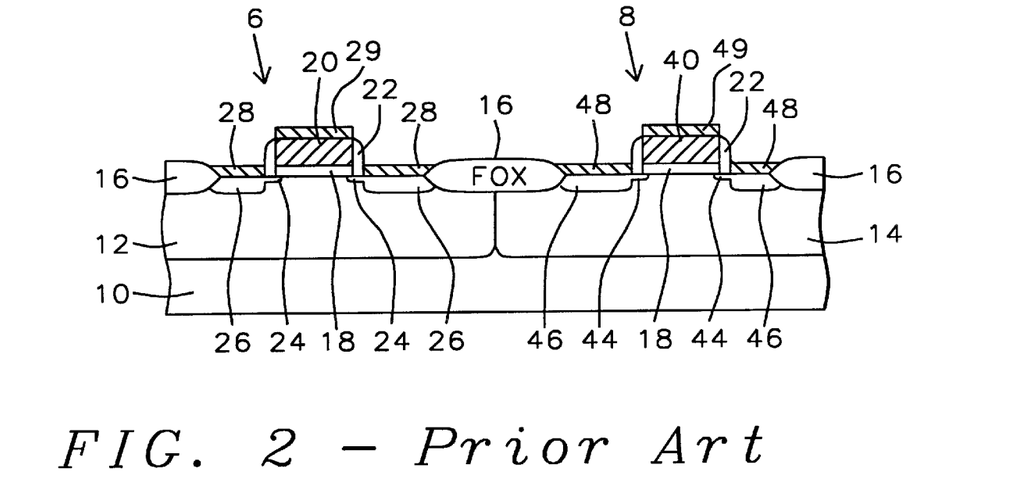
FIG. 2 is a cross section of a CMOS structure having self-aligned polysilicon gate MOSFETs formed by a prior art process after salicide contact metallurgy is formed.

A technique which has found widespread use in CMOS technology is the self-aligned silicide(SALICIDE) process. A layer of refractory metal, usually titanium is blanket deposited over the wafer 10. A thermal treatment, for example by rapid thermal annealing(RTA), causes the portions of the titanium in contact with silicon to react and form titanium silicide ($TiSi_2$). Those portions of the titanium layer over oxide such as the field isolation 16 and the sidewall spacers 22 do not react, providing the temperature of the RTA is sufficiently low, for example around 650° C. Referring now to FIG. 2, subsequent dissolution of the unreacted titanium using for example, an aqueous etchant containing $H_2O_2$ and $NH_4OH$, leaves the $TiSi_2$ 28 and 48 over the source/drain regions 26 and 46 and also 29 and 49 over the polysilicon gate electrodes 20 and 40 respectively.

When the dimensions of the devices shrink into the sub half-micron range, problems begin to appear in this conventional process. In particular as the devices become smaller, so too do the sidewall spacers 22. Consequently, bridging of $TiSi_2$ occurs between the source/drain regions and the polysilicon gate electrode. See Chang, C. Y. and Sze, S. M., "ULSI Technology" McGraw-Hill New York, (1996), p401.

The problem is further complicated by the fact that the thickness of the $TiSi_2$ formed over the p-type regions of the PMOS devices is not the same as that which is formed over the n-type source/drains of the NMOS devices. This is because the reaction which forms $TiSi_2$ on heavily doped silicon is dependent upon both the type and the concentration of impurities. This problem is has been pointed out by Mogami et.al. U.S. Pat. No. 5,571,735 who observes that the reaction forming $TiSi_2$ is suppressed when the Ti is deposited over silicon having concentrations of arsenic greater than $5 \times 10^{19}$ atoms/cm$^3$. On the other hand $TiSi_2$ is readily formed when the silicon upon which the Ti is deposited contains boron, arsenic in concentrations below $1 \times 10^{19}$ atoms/cm$^3$, or is undoped. It is therefore impossible to obtain metal silicide films of equal thickness when the titanium is deposited onto both heavily doped n- and p-type silicon surfaces as is the typical case in CMOS processing. Attempts at equalizing the thicknesses of $TiSi_2$ grown on the PMOS and NMOS structures by a single arsenic implant have succeeded in reducing the gate-to-source drain bridging problem. However, the high dosage and energy required results in degradation of the PMOS devices.

Another problem which manifests itself at small geometries is the difficulty of achieving low resistance $TiSi_2$ on narrow (<0.5 micron) polysilicon lines. See Chang, C. Y. and Sze, S. M., "ULSI Technology" McGraw-Hill, New York, (1996), p402. This is caused by the increased difficulty in converting the C49 small grain high resistance $TiSi_2$ crystalline phase to the C54 large grain low resistance crystalline phase by high temperature annealing. The structure consisting of a polysilicon layer and $TiSi_2$ layer is commonly referred to as a polycide structure. Mogami et.al. reports that a $TiSi_2$ film formed on polysilicon amorphisized by an arsenic implantation has a lower sheet resistance than $TiSi_2$ films formed on non-amorphized silicon. Polycide lines in which the polysilicon layer was pre-amorphized with arsenic do not exhibit increasing resistance as line width decreases below 1 micron.

Pre-amorphization implantation(PAI) of single crystal silicon with $Si^+$ and $Ge^+$ ions has been used to prevent boron channeling in shallow junction PMOS devices (Wolf, S. and Tauber, R. N., "Silicon Processing for the VLSI Era", Vol. 1, Lattice Press, Sunset Beach, Calif., (1986), p294). The ions are implanted immediately prior to the boron dopant implantation. Naguib, et.al., U.S. Pat. No. 4,683,645 deposits a Ti layer for the formation of $TiSi_2$ contacts and then implants $Ge^+$ ions to affect mixing of the Ti and Si. $Si^+$ ions are next implanted to amorphize the silicon to prevent boron channeling, followed by the implantation of the boron ions themselves. Kase, et.al., U.S. Pat. No. 5,145,794 cites the implantation of $Si^+$ and $Ge^+$ ions to pre-amorphize the silicon surface prior to the implantation of the boron dopant species $BF_2^+$. It was found that the high doses ($10^{15}$ atoms/cm$^2$) conventionally used to prevent boron channeling resulted in electrical degradation. Effective channeling reduction was achieved without electrical degradation by using reduced dosages of the order of $2-5 \times 10^{13}$ atoms/cm$^2$.

Ge and Si ions have also been found effective in facilitating the activation of impurity ions by amorphization. To this end Saito, U.S. Pat. No. 5,561,072 teaches a process of plasma implantation for forming very shallow junctions whereby the monocrystalline silicon substrate in the region of the plasma implantation is amorphized by introducing Si and Ge ions into the implantation plasma.

Pfiester, et.al., U.S. Pat. No. 4,835,112 implants germanium into the source/drain regions of MOSFETs after sidewall formation in a CMOS process. A salicide layer is then formed on the surface. Heavy doses of the n- and p-type dopants are then implanted through the salicide layer and into the subjacent silicon to form source/drain semiconductor elements. The Germanium serves to retard the diffusion of phosphorous. Aronowitz, et.al. U.S. Pat. No. 5,312,766 implant germanium into the source/drain regions of a MOSFET at a dose of $2 \times 10^{16}$ atoms per $cm^2$ and subject the wafer to a wet thermally oxidation whereupon the implanted germanium segregates to the surface to form a thin germanium rich layer. The layer then alloys with the contact metallurgy to form a low resistance contact.

Hefner, et.al. U.S. Pat. No. 5,254,484 cites an annealing method for recrystallizing silicon which has been amorphized by germanium or silicon implantation to retard impurity diffusion. Mader, et.al., U.S. Pat. No. 4,111,719 reports that the implantation of germanium reduces the occurrence of misfit dislocations formed in silicon, which has been heavily implanted with arsenic, during a subsequent high temperature drive-in step.

SUMMARY OF THE INVENTION

It is an object of this invention to provide a method for enhancing the formation of $TiSi_2$ over a silicon contact region.

It is another object of this invention to provide a method for forming a titanium silicide structure over a CMOS integrated circuit with reduced gate-to-source/drain bridging and without PMOS degradation.

It is yet another object of this invention to provide a method for preventing the electrical degradation of PMOS devices which occurs when arsenic is used as an amorphization implant for silicide formation.

It is another object of this invention to provide a method for forming high conductivity sub-micron width polycide lines.

These objects are accomplished by performing a dual ion implantation of germanium and arsenic prior to the deposition of the titanium. A first ion implantation of germanium is performed to amorphize a region, either of an active monocrystalline silicon surface, for example the source/drain regions of NMOS and PMOS devices or of a polysilicon surface such as a gate electrode or polysilicon conductive line. Germanium has an atomic mass close to that of arsenic, and thus is comparable to arsenic in it's amorphization capability but is neutral as a semiconductive dopant and therefore does not degrade p-type semiconductive device elements. An implantation of arsenic is then performed at a dose of about $1 \times 10^{14}$ atoms per $cm^2$ and at energies of less than 10 keV. This forms a very shallow, arsenic containing surface region which is entirely and well within the region amorphized by the germanium implant. The arsenic implanted region, although extending only about 100 Å from the surface is sufficient to equalize the growth of $TiSi_2$ over both the PMOS and NMOS semiconductive elements. This is enough to significantly reduce the occurrence of gate-to-source/drain shorts across the insulative sidewall.

DESCRIPTION OF THE PREFERRED EMBODIMENTS

Figure 3:
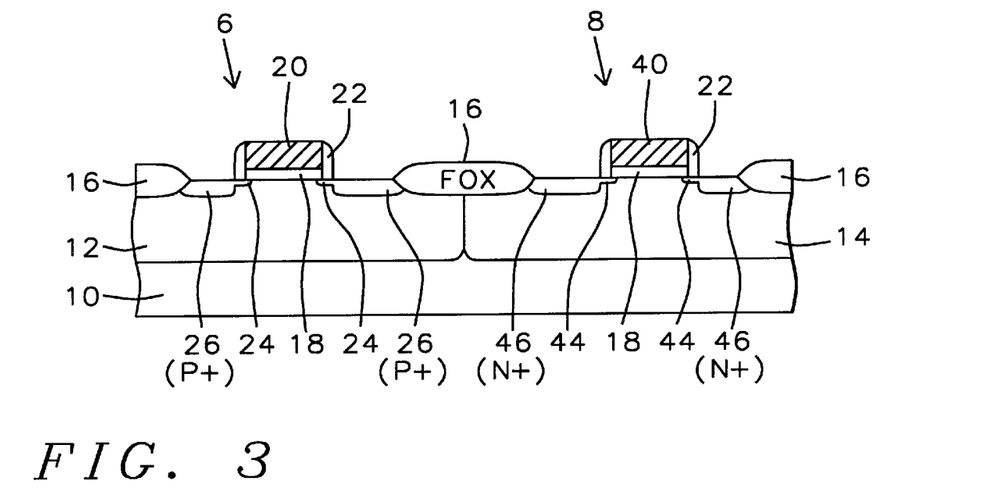
FIG. 3 is a cross section of a CMOS structure having self-aligned polysilicon gate MOSFETs at a stage of processing at which the method taught by the current invention is begun.

In a preferred embodiment of this invention a p-type monocrystalline silicon wafer is provided. Referring to FIG. 3, the wafer 10 is processed using well know twin-tub CMOS technology to a point where PMOS 6 and NMOS 8 FETs have been formed within its surface and isolated by a field oxide 16. The PMOS and NMOS devices are provided with LDD implants 24 and 44 respectively formed by the use of sidewall spacers 22.

By well known processes of photolithography and ion implantation, adjacent islands of p-type silicon 12 and n-type silicon 14 are formed in the surface of silicon wafer 10. Field oxide isolation(FOX) regions 16 are then formed by a well known process of local oxidation of silicon (LOCOS). A gate oxide 18 is then thermally grown in the exposed silicon regions and a conductive layer of polysilicon is deposited over it, typically by low pressure chemical vapor deposition(LPCVD). The polysilicon layer, is patterned by photolithography and etched by an anisotropic etching technique, usually reactive ion etching(RIE) to form the gate electrode 20 of the PMOS device 6 and the gate electrode 40 of the NMOS device 8.

An ion implant is next performed to form the lightly doped drain regions 24 and 44. The gate electrodes 20,40 serve as a mask, shielding the gate regions 18 from the implant, thereby making the source and drain regions self-aligned to the gate. Using a block out mask, the PMOS device 6 is covered while the source and drain regions 44 of the NMOS device 8 is implanted with an n-type dopant, for example arsenic or phosphorous. Similarly the NMOS device 8 is masked while the source and drain regions 24 of the PMOS device 6 are implanted with a p-type dopant, typically boron.

By depositing a conformal layer of silicon oxide over the wafer and anisotropically etching this layer back to the silicon by RIE, the sidewall spacers 22 are formed alongside the gate electrodes 20 and 40. Alternately, the sidewall spacers 22 may be formed of other suitable materials such as silicon nitride. Next, using a block out mask method, the heavily doped source and drain regions 26 and 46 are implanted using arsenic or phosphorous for the NMOS 8 device and boron for the PMOS device 6. The source/drain implants of the NMOS device 8 are formed using arsenic at a dose of $4 \times 10^{15}$ atoms $cm^{-2}$ or thereabout at an energy of 30 keV or thereabout. The source/drain implants of the PMOS device 6 are formed using $BF_2^+$ at a dose of $5 \times 10^{15}$ atoms $cm^{-2}$ or thereabout at an energy of 20 keV or thereabout.

The procedures just described are well known and are understood by those in the art. The next processing steps which include the implementation of the key features of the current invention, will be illustrated using only a portion of the PMOS device. Thereby the fine details of the invention can be best described. These steps are illustrated by FIGS. 4 through 8 wherein an enlarged portion of the PMOS device 6 of FIG. 3 is shown. There are no masking steps in these procedures so all the structures shown in FIG. 3 are to be understood to be subjected to processing identical to the PMOS device 6.

Figure 4:
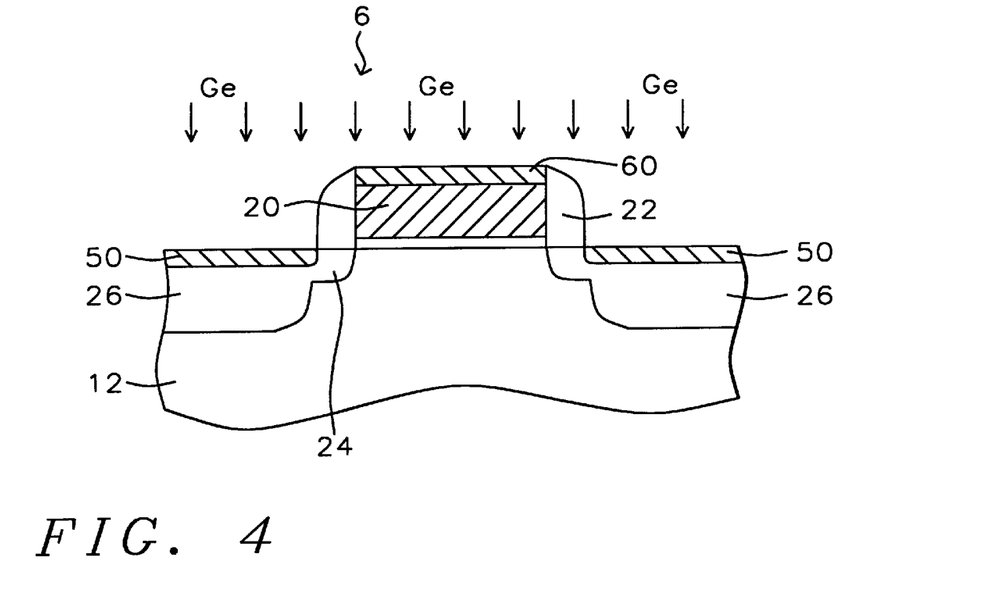
FIG. 4 through FIG. 8 are cross sections showing the various stages of processing of the PMOS device of FIG. 3 according to the method of the current invention.

Referring now to FIG. 4, the wafer is blanket implanted with germanium. A conventional ion implanter, such as the model 9500 xR manufacture by Applied Materials Corp., of Santa Clara Calif., may be used. The germanium is implanted at a dose of between about $3 \times 10^{14}$ and $2 \times 10^{15}$ atoms/cm$^2$ at a energy of between about 20 and 60 keV. The implantation forms a region 50 on the surface of the source/drain region 26 which is amorphized to a depth of about 300 to 800 Å. A corresponding region 60 on the polysilicon gate 20 is similarly amorphized to a depth of about 300 to 800 Å.

Figure 5:
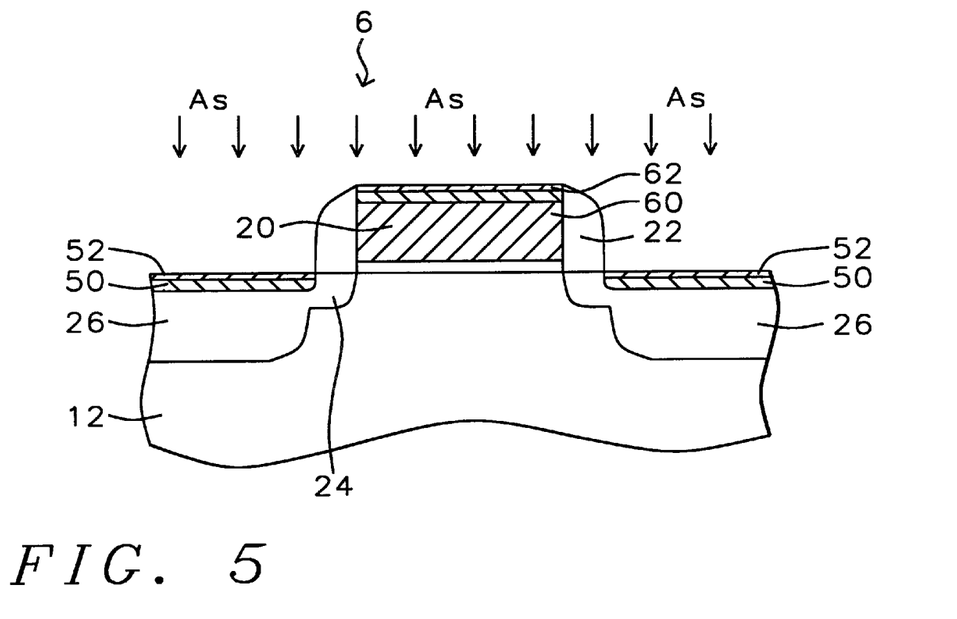

Next, the wafer is blanket implanted with arsenic at an energy of between about 5 and 10 keV at a dose of between about $5 \times 10^{13}$ and $5 \times 10^{14}$ atoms cm$^{-3}$. This energy places the centroid of the low dosage implant in a region 52 less than about 100 Angstroms beneath the silicon surface with a straggle of less than about 30 Angstroms. A corresponding arsenic implanted region 62 is formed on the polysilicon gate 40.

Figure 6:
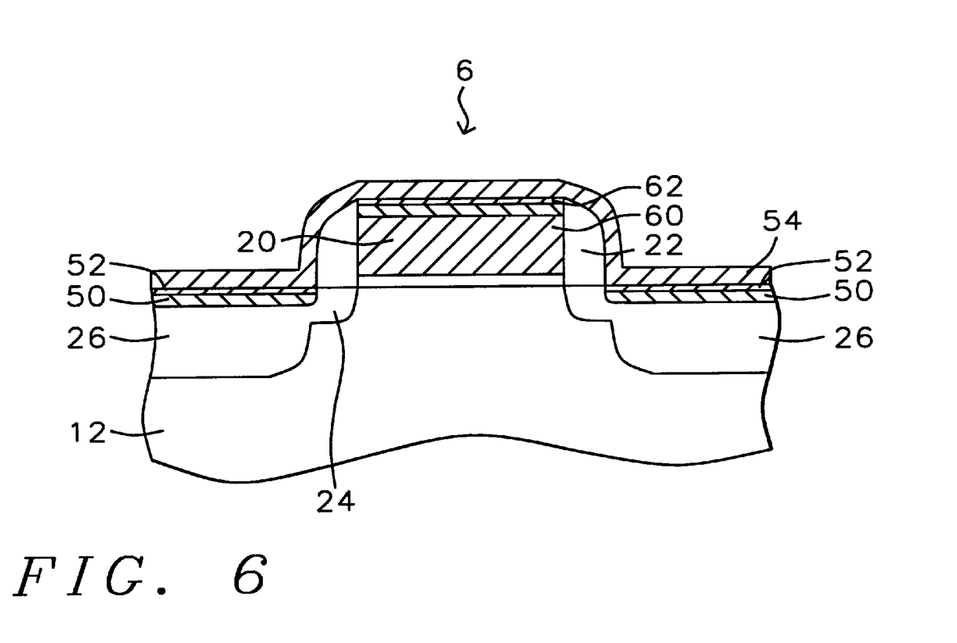

Referring now to FIG. 6, a composite Ti/TiN layer 54 having a thickness of between about 475 and 600 Angstroms is deposited over the wafer, preferably by sputtering. The Ti/TiN layer 54 is formed by first sputtering a titanium layer having a thickness of between about 275 and 400 Angstroms or thereabout onto the wafer and immediately thereafter, without breaking vacuum, sputtering a TiN layer having a thickness of 200 Angstroms or thereabout over the titanium layer. This may be accomplished by sputtering a titanium target, first with argon to form the Ti layer, and then with nitrogen to form the TiN layer. Alternately interchangeable targets of titanium and of titanium nitride may be used in the same chamber. Refractory metals other than titanium may also be used to form the metal silicide layer over the exposed silicon surfaces. Suitable metals include cobalt, molybdenum, and tungsten. Similarly the TiN layer may be either omitted or substituted by an alternative protective layer.

Figure 7:
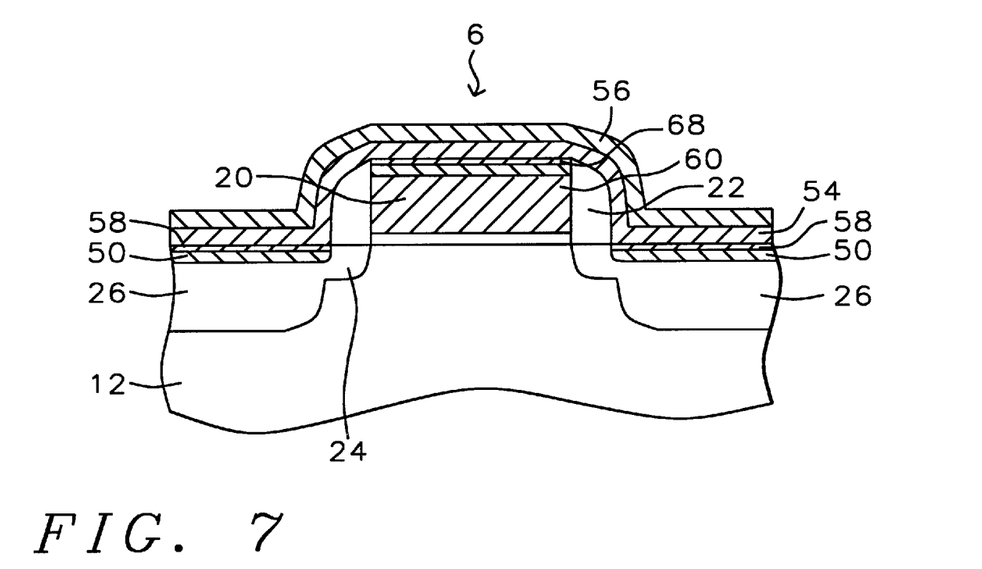

A first rapid thermal anneal(RTA) is performed at a temperature of between about 675 and 740° C. or thereabout for a period of between about 10 and 40 seconds in a nitrogen ambient. During this period a layer of titanium silicide (TiSi$_2$) 68 forms by reaction of the Ti sub-layer of the composite Ti/TiN layer 54 with the arsenic implanted silicon surface. The shallow arsenic implant essentially balances the surfaces of the PMOS and NMOS devices so that the TiSi$_2$ nucleates and grows evenly on the gates and source/drain regions of both n- and p-channel devices. In the TiSi$_2$ growth process, the arsenic implanted layer 52 over the source/drain regions and 62 over the polysilicon gate 20 is entirely consumed by the silicide layer 68. The arsenic is thereby removed from the semiconductive material and thus prevented from subsequently participating as an electrically active donor. The low dose, shallow arsenic implant, having balanced the growth of silicide over the n- and p-type regions, now, cannot compromise the conductivity of the p-type regions.

During the first RTA step, nitrogen from the ambient, diffuses through the TiN in the composite Ti/TiN layer 54 and reacts with the outer surface of the Ti to form TiN, thereby consuming Ti over the sidewall regions 22. This inhibits the transport of silicon over the sidewall regions and thereby prevents bridging of the TiSi$_2$ layer between the gate electrode 20 and the source/drain regions 26. The wafer is next subjected to an aqueous etching procedure wherein the TiN and residual titanium of the Ti/TiN layer 54 are selectively removed leaving the TiSi$_2$ contacts 68 over the polysilicon gate 20 and 58 over the source/drain active areas 26. A suitable and commonly used aqueous etchant contains $H_2O_2$ and $NH_4OH$.

Figure 8:
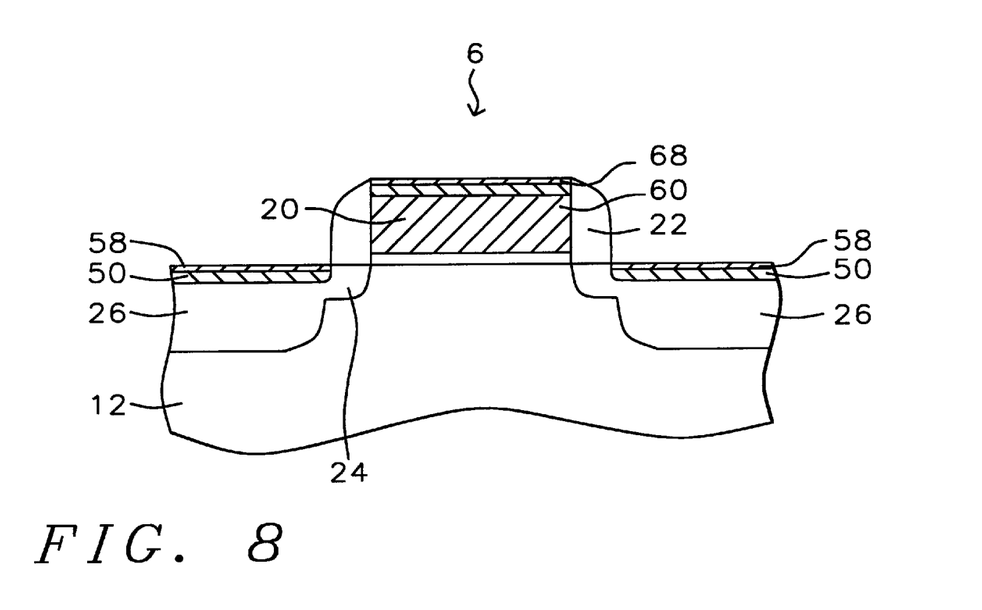

A second rapid thermal anneal, performed at between about 830 and 950° C., for a period of between about 10 and 40 seconds, completes the formation of the TiSi$_2$ contact. During this annealing period, re-crystallization of the pre-amorphized regions 50,60 takes place as well as a crystalline phase transition of the low conductivity C49 phase of TiSi$_2$ to a high conductivity C54 phase. The presence of the pre-amorphized regions 50, 60 facilitates the nucleation of this conversion. Not only is the achievement of the high conductivity C54 phase important to good source/drain contact formation, it is also particularly important for achieving high conductivity polycide lines of less than 1 micron in width and suppressing bridging. The gate electrode structure consisting of the polysilicon layer 20 and TiSi$_2$ layer 68 is an example of such a polycide line.

Figure 9:
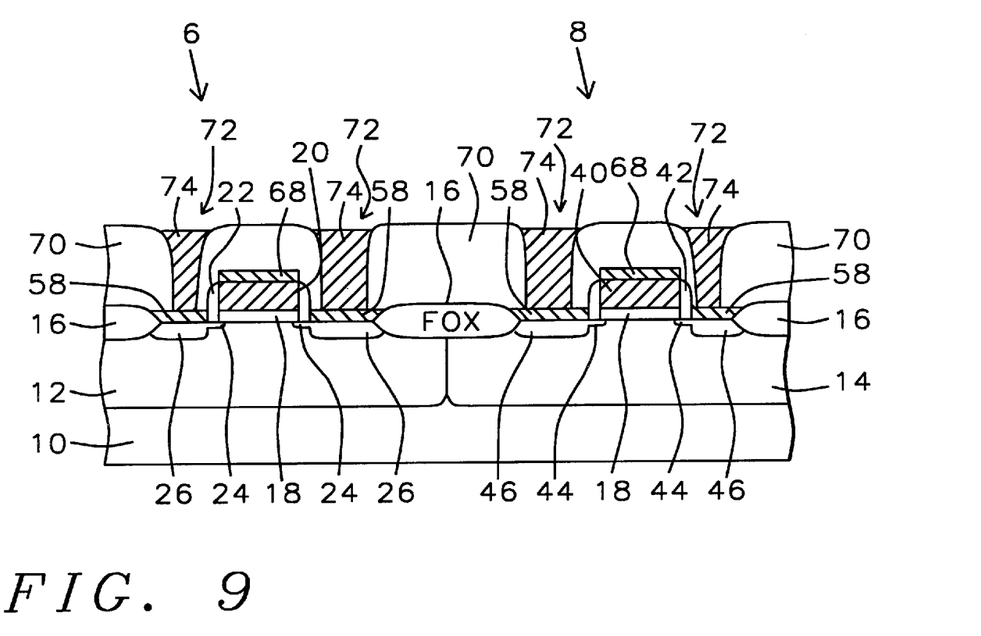
FIG. 9 is a cross section of a CMOS structure having self-aligned polysilicon gate MOSFETs after the implementation of the method taught by the current invention and after contact metallurgy has been formed.

Processing of the CMOS integrated circuit then proceeds by the deposition of an insulative layer 70 over the wafer (FIG. 9). This layer 70, typically of a flowable glass such as borophosphosilicate glass, is thermally flowed to planarized the surface topology. Alternately, the layer 70 may be planarized by chemical mechanical polishing which is a well known planarization process. Contact openings 72 the source/drain regions 26 and 46 are then patterned and etched with RIE. Comparable contact openings (not shown) to the TiSi$_2$ layer 68 over the gate electrodes 20 and 40 are simultaneously formed elsewhere, preferably in regions above or below the plane of the page where the gate electrodes 20 and 40 pass over field oxide 16. Using well known procedures, a preferred barrier metallurgy, comprising Ti/TiN is formed over the wafer followed by the formation of tungsten plugs 74.

While the embodiment of this invention utilized a p-type silicon substrate, an n-type silicon substrate could also be used in which to form the n-well 12 and the p-well 14 without departing from the concepts therein provided. Similarly, the CMOS structures could be also formed by a single well process or by an epitaxial process.

While the embodiments of this invention teach the formation of titanium silicide layers to form high conductivity layers and contacts, it is to be understood that silicides of other metals, for example of cobalt, nickel, or tungsten may be also formed by the method of the invention.

While this invention has been particularly shown and described with reference to the preferred embodiments thereof, it will be understood by those skilled in the art that various changes in form and details may be made without departing from the spirit and scope of the invention.

What is claimed is:

1. A method for forming contacts to p- and n-channel self-aligned polysilicon gate MOSFETs comprising:
   (a) providing a silicon wafer having at least one p-channel self aligned polysilicon gate MOSFET and at least one n-channel self-aligned polysilicon gate MOSFET formed within and upon its surface, said at least one p-channel self aligned polysilicon gate MOSFET and said at least one n-channel self-aligned polysilicon gate MOSFET having exposed impurity doped source/drain active areas and exposed polysilicon gate electrodes with adjacent insulative sidewall spacers;

(b) implanting germanium atoms into said silicon wafer thereby forming amorphous regions on said source/drain areas and said gate electrodes;

(c) implanting arsenic atoms into said amorphous regions thereby forming arsenic doped regions which lie wholly within said amorphous regions;

(d) depositing a refractory metal layer on said silicon wafer;

(e) depositing a protective layer over said refractory metal layer;

(f) performing a first thermal anneal of said silicon wafer whereby a portion of said refractory metal layer reacts with said polysilicon layer to form a silicide;

(g) etching said wafer with an aqueous etchant thereby removing said protective layer and residual refractory metal layer;

(h) performing a second thermal anneal of said silicon wafer;

(i) depositing an insulative layer over said silicon wafer;

(j) etching contact openings in said insulative layer; and (k) depositing a conductive material into said openings thereby forming contacts.

2. The method of claim 1 wherein said germanium atoms are implanted at a dose of between about $3 \times 10^{14}$ and $2 \times 10^{15}$ atoms per $cm^2$ and at an energy of between about 20 and 60 keV.

3. The method of claim 1 wherein said arsenic atoms are implanted at a dose of between about $5 \times 10^{13}$ and $5 \times 10^{14}$ atoms per $cm^2$ and at an energy of between about 5 and 10 keV.

4. The method of claim 1 wherein said refractory metal layer is selected from the group consisting of titanium, cobalt, molybdenum, and tungsten.

5. The method of claim 1 wherein said protective layer is titanium nitride.

6. The method of claim 1 wherein said refractory metal layer is deposited at a thickness of between about 250 and 400 Angstroms and said protective layer is deposited at a thickness of 200 Angstroms or thereabout.

7. The method of claim 1 wherein said first thermal anneal is performed by rapid thermal annealing at a temperature between about 675° C. and 740° C. for a period of between about 10 and 40 seconds in an ambient of nitrogen.

8. The method of claim 1 wherein said second thermal anneal is performed by rapid thermal annealing at a temperature between about 830° C. and 950° C. for a period of between about 10 and 40 seconds.

9. A method for forming a polycide gate electrode comprising:

(a) providing a silicon wafer having an active area;

(b) forming a gate oxide;

(c) forming a polysilicon gate electrode on said gate oxide;

(d) implanting germanium atoms into said silicon wafer thereby forming an amorphous region on said polysilicon gate electrode;

(e) implanting arsenic atoms into said amorphous region thereby forming an arsenic doped region, wherein said arsenic doped region is confined within said amorphous region;

(f) depositing a metal layer on said silicon wafer;

(g) depositing a protective layer over said metal layer;

(h) performing a first thermal anneal of said silicon wafer whereby a portion of said metal layer reacts with said polysilicon gate electrode forming a silicide;

(i) etching said wafer with an aqueous etchant, thereby removing said protective layer and residual refractory metal layer forming a polycide gate electrode; and (j) performing a second thermal anneal of said silicon wafer.

10. The method of claim 9 wherein said germanium atoms are implanted at a dose of between about $3 \times 10^{14}$ and $2 \times 10^{15}$ atoms per $cm^2$ and at an energy of between about 20 and 60 keV.

11. The method of claim 9 wherein said arsenic atoms are implanted at a dose of between about $5 \times 10^{13}$ and $5 \times 10^{14}$ atoms per $cm^2$ and at an energy of between about 5 and 10 keV.

12. The method of claim 9 wherein said protective layer is titanium nitride.

13. The method of claim 9 wherein said refractory metal layer is selected from the group consisting of titanium, cobalt, molybdenum, and tungsten.

14. The method of claim 9 wherein said refractory metal layer is deposited at a thickness of between about 250 and 400 Angstroms and said protective layer is deposited at a thickness of 200 Angstroms or thereabout.

15. The method of claim 9 wherein said first thermal anneal is performed by rapid thermal annealing at a temperature between about 675° C. and 740° C. for a period of between about 10 and 40 seconds in an ambient of nitrogen.

16. The method of claim 9 wherein said second thermal anneal is performed by rapid thermal annealing at a temperature between about 830° C. and 950° C. for a period of between about 10 and 40 seconds.

17. A method for forming a polycide line comprising:

(a) providing a silicon wafer having an insulative layer;

(b) forming a polysilicon line on said insulative layer;

(c) implanting germanium atoms into said polysilicon line thereby forming an amorphous region;

(d) implanting arsenic atoms into said amorphous region thereby forming an arsenic doped region, wherein said arsenic doped region is confined within said amorphous region;

(e) depositing a refractory metal layer on said silicon wafer;

(f) depositing a protective layer over said metal layer;

(g) performing a first thermal anneal of said silicon wafer whereby a portion of said refractory metal layer reacts with said polysilicon line forming a silicide;

(h) etching said wafer with an aqueous etchant, thereby removing said protective layer and residual refractory metal layer forming a polycide line; and (i) performing a second thermal anneal of said silicon wafer.

18. The method of claim 17 wherein said germanium atoms are implanted at a dose of between about $3 \times 10^{14}$ and $2 \times 10^{15}$ atoms per $cm^2$ and at an energy of between about 20 and 60 keV.

19. The method of claim 17 wherein said arsenic atoms are implanted at a dose of between about $5 \times 10^{13}$ and $5 \times 10^{14}$ atoms per $cm^2$ and at an energy of between about 5 and 10 keV.

20. The method of claim 17 wherein said refractory metal layer is selected from the group consisting of titanium, cobalt, molybdenum, and tungsten.

21. The method of claim 17 wherein said protective layer is titanium nitride.

22. The method of claim 17 wherein said refractory metal layer is deposited at a thickness of between about 250 and 400 Angstroms and said protective layer is deposited at a thickness of 200 Angstroms or thereabout.

23. The method of claim 17 wherein said first thermal anneal is performed by rapid thermal annealing at a temperature between about 675° C. and 740° C. for a period of between about 10 and 40 seconds in an ambient of nitrogen.

24. The method of claim 17 wherein said second thermal anneal is performed by rapid thermal annealing at a temperature between about 830° C. and 950° C. for a period of between about 10 and 40 seconds.

* * * * *